United States Patent Office 3,672,980

Patented June 27, 1972

3,672,980

METHOD OF RAPIDLY DETECTING CONTAMINATED SEMICONDUCTOR SURFACES

William B. Glendinning, Belford, and Wellington B. Pharo, Neptune, N.J., assignors to the United States of America as represented by the Secretary of the Army No Drawing. Filed Dec. 1, 1970, Ser. No. 94,150
Int. Cl. B44d *1/18*; C23c *11/00*
U.S. Cl. 117—201 3 Claims

ABSTRACT OF THE DISCLOSURE

A silicon substrate is rapidly screened for surface contamination by exposing the substrate surface to a chemical vapor environment of nitric oxide, hydrogen fluoride and water at about 27 degrees C. to obtain a transparent surface film of about 50 to 100 angstroms in thickness, and then examining the film for surface uniformity and for the presence of geometric shapes.

BACKGROUND OF THE INVENTION

This invention relates in general to a method of rapidly screening semiconductor surfaces for contamination prior to integrated device processing, and in particular, to a rapid, nondestructive method for screenign defective silicon substrates prior to integrated device pocessing.

Monolithic silicon circuits are the integrated circuits most widely used today. The fabrication of these circuits requires initially, the use of ultra clean silicon semiconductor surfaces. If the surface is contaminated in any manner, a defective monolithic circuit will result. Moreover, silicon substrate surfaces that are uncontaminated are also required in the fabrication of high quality silicon transistors and diodes of all types.

Heretofore, contaminated silicon surfaces could only be detected using elaborate, expensive and time consuming apparatus such as scanning electron beam microscopy.

SUMMARY OF THE INVENTION

The general object of this invention is to provide a method of rapidly screening semiconductor surfaces for contamination. A further object of the invention is to provide such a method prior to integrated device processing. A particular object of the invention is to provide rapid, nondestructive method for screening a defective silicon substrate surface prior to integrated device processing.

It has been found that a rapid, nondestructive method for screening a defective silicon substrate surface can be provided by exposing the substrate surface to a chemical vapor environment of nitric oxide (NO), hydrogen fluoride (HF), and water vapors at about 27 degrees C. to obtain a transparent surface film of about 50 to 100 angstroms in thickness, and then examining the film for surface uniformity and for the presence of geometric shapes.

DETAILED DESCRIPTION OF THE PREFERRED EMBODIMENT

A silicon wafer is placed in a suitable closed chamber such as a plastic bell jar and exposed to a chemical vapor pressure environment of 1 atmosphere consisting of about 40 millimeters mercury of nitric oxide, about 9 millimeters mercury of hydrogen fluoride, about 2 millimeters mercury of water and inert carrier gas for about 1 minute at about 27 degrees C. A transparent top surface film of about 50 to 100 angstroms in thickness results from the chemical exposure. The film which adheres to the silicon surface portrays by tis uniformity the degree or status of cleanliness of the original silicon surface.

That is, if the film appears faintly but uniformly across the entire surface, the silicon wafer has a high quality surface and can be used directly for further device fabrication. On the other hand, if any faint geometric shape appear on the surface as a result of chemical exposure, the surface is unclean and the contaminated area is existent to the extent that the geometric shapes, spots, dots, blotches, etc. are discernible. Such a wafer is unclean and should be recleaned prior to any further device fabrication steps.

The delineating film caused by exposure to the chemical vapor environment can be removed if desired by a few seconds of immersion in mild hydrofluoric acid solution. However, tests of the electronic properties of the film show that it has very low charge content in the form of ions and would not interfere in the quality which would result if the film were present in subsequent thermal oxidation or epitaxial deposition steps of device fabrication. Moreover, in a subsequent reducing epitaxial environment, such a thin film is decomposed instantaneously. At any rate, screened samples can be used immediately for further device processing with or without the thin delineation film. In the case of detected unclean wafers, the film should be removed by HF immersion as described previously. The nature of the transparent surface or delineating film is not known, but it is believed to be composed of complex silicon compounds of nitrides, oxides and fluorides.

The invention is simple in the type of equipment and materials required. That is, the silicon wafer or substrate is placed on an inert Teflon type base or other suitable mounting in the closed chamber so that the top surface of the wafer is exposed to the chemical vapor environment. The time required for exposure is up to 2 minutes of which about 1 minute is preferred. The temperature during exposure is maintained between about 25 degrees C. and 40 degrees C. The chemical vapor environment can be in the range of about 20 to 200 millimeters mercury of nitric oxide, about 7 to 11 millimeters mercury of hydrogen fluoride, about 1.5 to 3 millimeters mercury of water and up to 1 atmosphere of inert gas such as helium, argon, etc. The screening of water surfaces can be accomplished with the unaided eye in batch fashion at negligible cost. Significantly, no industrial, university, or other institution has had at their disposal such an evaluation tool giving detailed contamination topology. Moreover, the screening process should be able to be adapted to a screening production process. Then too, the varying of the particular chemical vapor environment can make the method applicable to the screening of other semiconductor materials such as gallium arsenide, germanium, etc.

We wish it to be understood that we do not desire to be limited to the exact details of construction shown and described, for obvious modifications will occur to a person skilled in the art.

What is claimed is:

1. A rapid nondestructive method for screening defective silicon substrates comprising exposing the top surface of the silicon substrate in a closed chamber at about 25 degrees C. to 40 degrees C. and up to 2 minutes to a chemical vapor environment of nitric oxide, hydrogen fluoride an water to obtain a transparent surface film of about 50 to 100 angstroms in thickness and then examining the film for surface uniformity and for the presence of geometric shapes.

2. The method according to claim 1 wherein the chemical vapor environment is about 20 to 200 millimeters mercury of nitric oxide, about 7 to 11 millimeters mercury of hydrogen fluoride, about 1.5 to 3 millimeters mercury of water, and up to 1 atmosphere of inert gas.

3. The method according to claim 1 wherein the chemical vapor environment is about 40 millimeters mercury of nitric oxide, about 9 millimeters mercury of hydrogen fluoride, about 2 millimeters mercury of water, and up to 1 atmosphere of inert gas, the time of exposure about 1 minute, and the temperature during exposure about 27 degrees C.

References Cited

UNITED STATES PATENTS

| | | | |
|---|---|---|---|
| 3,287,162 | 11/1966 | Chu et al. | 117—201 X |
| 3,396,052 | 8/1968 | Rand | 117—201 |
| 3,442,700 | 5/1969 | Yoshioka et al. | 117—201 |

OTHER REFERENCES

El. Koo, The Surface Properties of Oxidized Silicon, Springer-Verlag New York, Inc., New York, 1967, pp. 34, 40.

ALFRED L. LEAVITT, Primary Examiner

K. P. GLYNN, Assistant Examiner

U.S. Cl. X.R.

117—106 A, 106 R